United States Patent [19]
Cochran et al.

[11] Patent Number: 5,929,340
[45] Date of Patent: Jul. 27, 1999

[54] ENVIRONMENTAL TEST APPARATUS WITH AMBIENT-POSITIONED CARD SUPPORT PLATFORM

[75] Inventors: John Cochran, Fort Wayne, Ind.; Roger L. Perry, Franksville, Wis.

[73] Assignee: RPI, Inc., Racine, Wis.

[21] Appl. No.: 09/094,708

[22] Filed: Jun. 15, 1998

Related U.S. Application Data

[63] Continuation-in-part of application No. 08/841,216, Apr. 30, 1997.

[51] Int. Cl.⁶ ........................................................ G01B 7/16
[52] U.S. Cl. ................................. 73/766; 324/700; 374/50
[58] Field of Search .................................. 73/766, 865.8; 324/500, 760; 374/50

[56] References Cited

U.S. PATENT DOCUMENTS

| | | | |
|---|---|---|---|
| 3,599,476 | 8/1971 | Corbett | 374/50 |
| 3,656,058 | 4/1972 | Leathers | 324/158 F |
| 4,572,283 | 2/1986 | Vanderschaaf | 165/61 |
| 4,683,424 | 7/1987 | Cutright et al. | 324/158 F |
| 4,949,031 | 8/1990 | Szasz et al. | 324/158 F |
| 5,003,156 | 3/1991 | Kilpatrick et al. | 219/209 |
| 5,021,732 | 6/1991 | Fuoco et al. | 324/158 F |
| 5,093,982 | 3/1992 | Gussman | 29/705 |
| 5,103,168 | 4/1992 | Fuoco | 324/760 |
| 5,226,326 | 7/1993 | Polen | 73/571 |
| 5,397,998 | 3/1995 | Soeno et al. | 324/760 |

Primary Examiner—Max H. Noori
Attorney, Agent, or Firm—Jansson, Shupe, Bridge & Munger Ltd.

[57] ABSTRACT

An environmental test apparatus has a thermal chamber for stress testing electronic products and a wall separating the thermal chamber from ambient air around the apparatus. In the improvement, the wall comprises a pair of barrier walls having a flexible partition interposed between them. The barrier walls and the flexible partition substantially isolate the ambient air from the thermal chamber. The apparatus also includes a platform in the ambient air and a feedthrough card extending from the platform through the flexible partition into the thermal chamber.

In one, more specific embodiment, the barrier walls are below the thermal chamber and the platform is below the barrier walls. In other embodiments, the barrier walls are lateral to the thermal chamber and the apparatus includes one or two racks, also lateral to such chamber. One or respective platforms are supported on the rack(s).

10 Claims, 10 Drawing Sheets

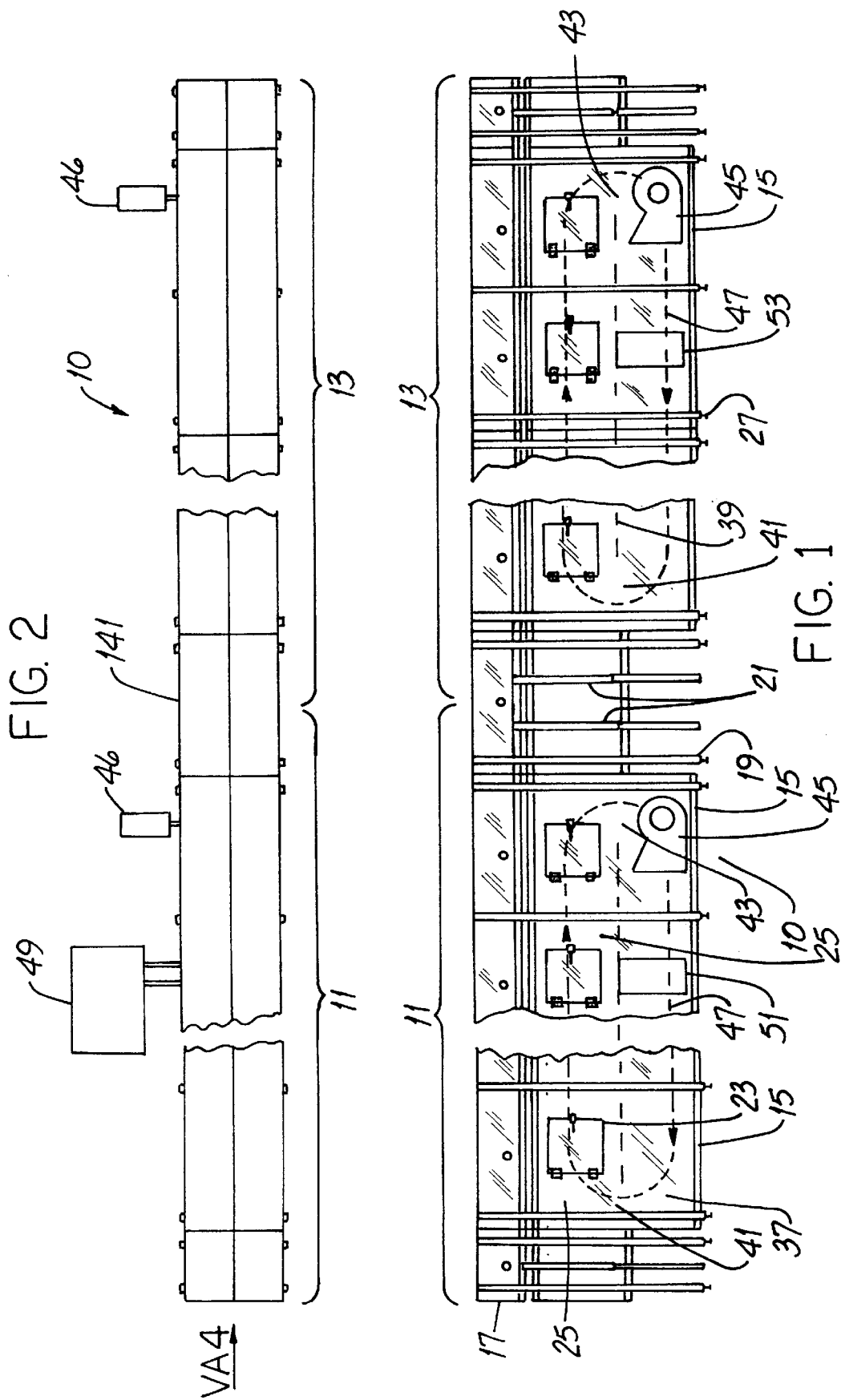

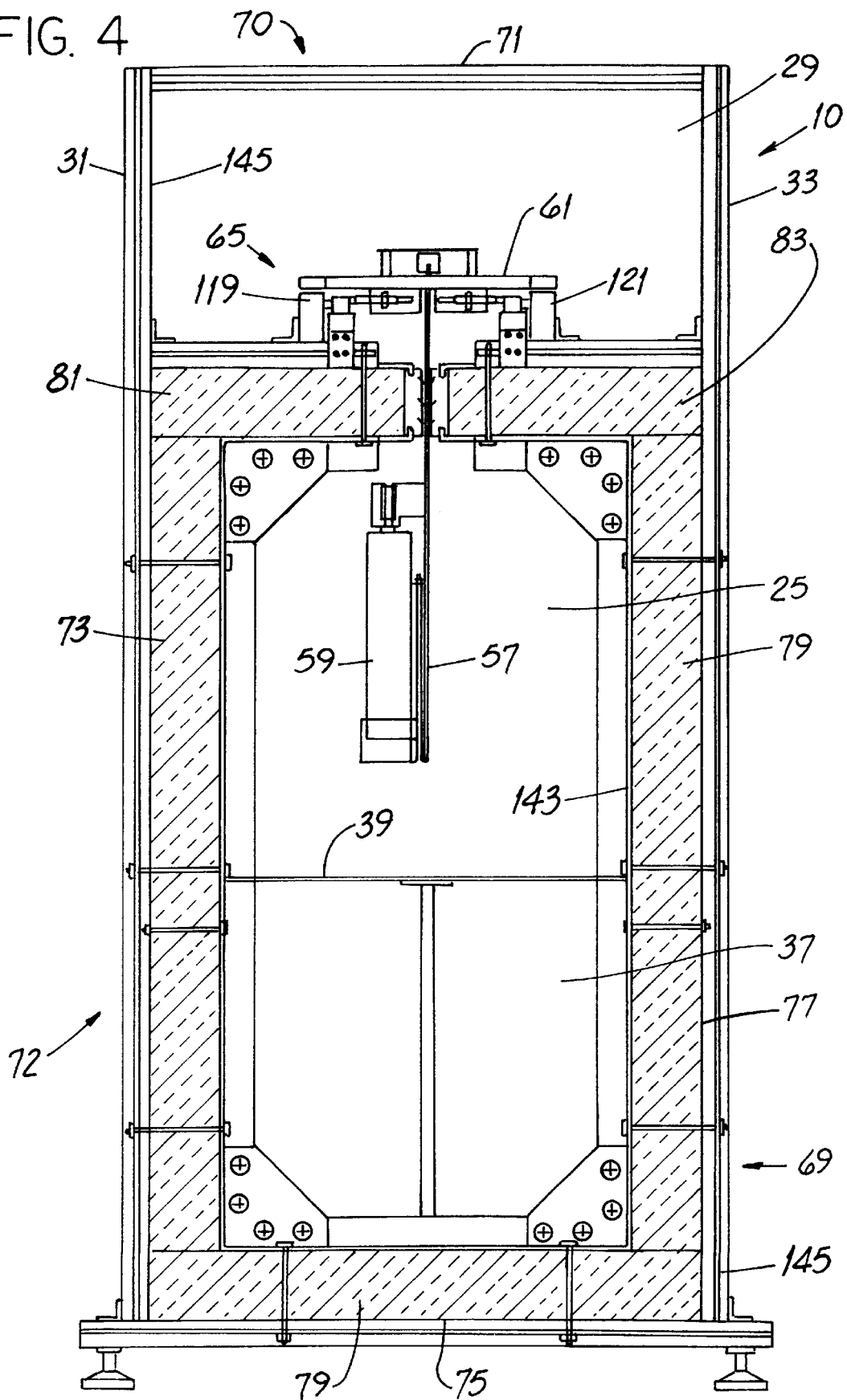

ENVIRONMENTAL TEST APPARATUS WITH AMBIENT-POSITIONED CARD SUPPORT PLATFORM

RELATED APPLICATION

This application is a continuation-in-part of co-pending application Ser. No. 08/841,216 filed on Apr. 30, 1997, and titled ENVIRONMENTAL TEST APPARATUS WITH PARTITION-ISOLATED THERMAL CHAMBER.

FIELD OF THE INVENTION

This invention relates generally to electrical measuring and testing and, more particularly, to product measuring and testing involving temperature cycling.

BACKGROUND OF THE INVENTION

Environmental test chambers are widely used to test electrical products such as printed circuit boards and other electrical/electronic products which include a printed circuit board as a component part. Such testing involves monitoring certain electrical operating characteristics of the product while it: is undergoing extreme changes in temperature. Temperature cycling over a range of +125° C. to −65° C. (about +255° F. to −85° F.) is not uncommon and is often accompanied by extreme changes in humidity and/or by vibrating the product under test. In the industry, testing of this type is often referred to as "stress testing."

A primary reason that product stress testing is undertaken is to identify particular products (within a larger group of products) which exhibit characteristics evidencing probable premature failure. And such testing is intended to cull out those products which actually fail during test. In the vernacular of the industry, such products are said to exhibit "infant mortality." Those products which do not exhibit infant mortality are much more reliable in the automotive, aircraft, military or other application in which they are used. U.S. Pat. Nos. 3,656,058 (Leathers); 4,683,424 (Cutright et al.); 4,949,031 (Szasz et al.) and 5,021,732 (Fuoco et al.) all disclose apparatus used for environmental stress testing.

Designers of environmental test chambers must deal with a number of engineering considerations. One is the rapidity with which the temperature in the product-containing chamber can be changed. In a test chamber having refrigeration and heating systems of a particular thermal size, the rate at which the temperature can be changed is, in significant part, a function of the mass (e.g., the mass of the products and product carriers) in the chamber. This is so because the heat absorbed by the chamber contents and the heat which must be removed therefrom is a function of such mass.

A household refrigerator is a good analogy of the foregoing. For a particular refrigerator, two pounds of foodstuffs in the refrigerator are more quickly cooled to a particular temperature than twenty pounds of foodstuffs. And as a corollary, cooling twenty pounds of foodstuffs to a particular temperature within a stated time requires a larger refrigeration unit than is required to cool two pounds of foodstuffs to the same temperature within the same time.

Another engineering consideration involves the equipment used to monitor the electrical operating characteristics of the products under test. Such equipment is temperature sensitive and must be maintained nominally at room ambient conditions. In other words, such equipment should not be in the chamber with the products undergoing test.

Still another engineering consideration is whether to configure the test chamber for batch-process or continuous-process testing. The apparatus of above-noted Szasz et al. patent is for batch testing in that a number of products are placed on a pallet which is inserted into the chamber. All the products on the pallet undergo test simultaneously and after such test is completed, the pallet and its "batch" of products is removed and another pallet loaded with products to be tested is inserted.

On the other hand, the vibration chamber disclosed in U.S. Pat. No. 5,226,326 (Polen et al.) may be referred to as a type of continuous testing arrangement. Such chamber uses a conveyor having spaced pairs of rollers to grasp respective edges of flatwise-oriented printed circuit boards to be tested. Similarly, U.S. Pat. No. 5,397,998 (Soeno et al.) discloses several different arrangements of a conveyor and products to be tested carried atop such conveyor. In one arrangement, feeder apparatus along the conveyor supply electric power to the products during burn-in and the "burned-in" product are then tested after exiting at the end of the conveyor.

While these earlier arrangements are thought to have been generally satisfactory for their intended uses, they are not without disadvantages for some types of applications. For example, the conveying arrangements shown in the Soeno et al. patent apparently do not permit instrumented product testing while the product is moving through the chamber. In other words, such instrumented testing is carried out after the product leaves the burn-in chamber. The "failure mode" characteristics exhibited by the products while in the burn-in chamber and after they leave such chamber may differ markedly.

Yet another disadvantage of the conveying arrangements of the Soeno et al. patent is that the mass of the conveyor (as well as that of the product to be tested) is in the burn-in chamber. Chamber temperature changes can be accomplished only by adding heat to or removing heat from the conveyor components.

Still another disadvantage of prior art arrangements is that they seemingly have not appreciated how to configure test chambers so that the size and capacity thereof can be selected or changed to suit a particular application. For example, the arrangement shown in FIG. 5 of the Polen et al. patent apparently has a fixed length which cannot be changed. At least, there is no suggestion to the contrary.

A new environmental test apparatus which addresses certain shortcomings of earlier apparatus would be an important advance in the art.

OBJECTS OF THE INVENTION

It is an object of the invention to provide an environmental test apparatus which overcomes certain problems and shortcomings of the prior art.

Another object of the invention is to provide an environmental test apparatus which is useful for stress testing electrical and electronic products.

Another object of the invention is to provide an environmental test apparatus which permits simultaneous product electrical testing and temperature stress testing.

Still another object of the invention is to provide an environmental test apparatus which minimizes the mass contained in the thermal chamber.

Another object of the invention is to provide an environmental test apparatus which implements continuous process testing.

Another object of the invention is to provide an environmental test apparatus by which continuous process testing may be carried out while maintaining the test instrumentation substantially at room ambient conditions.

Yet another object of the invention is to provide an environmental test apparatus which may be "custom-configured" for any one of a variety of applications. How these and other objects are accomplished will become apparent from the following descriptions and from the drawings.

SUMMARY OF THE INVENTION

The invention involves an environmental test apparatus of the type having a thermal chamber for stress testing electronic products. A wall separates the thermal chamber from ambient air around the apparatus.

In the improvement, the wall comprises a pair of barrier walls having a flexible partition interposed between them. The barrier walls and the flexible partition cooperate to substantially isolate the ambient air from the thermal chamber. The apparatus also includes a platform in the ambient air and a feedthrough card extending from the platform through the flexible partition into the thermal chamber.

In a more specific embodiment of the invention, the barrier walls are below the thermal chamber and the platform and its conveyor are below the barrier walls. Preferably, the carrier and platform are mounted on an underframe below the thermal chamber in ambient air.

The vertically-oriented feedthrough card extends upwardly from the platform. Such card has a distal edge and, most preferably, is guided along its distal edge by a guide track, e.g., a grooved guide track. The track is affixed to the panel separating the thermal chamber from the circulating air plenum above such chamber.

In another, more specific embodiment of the invention, the apparatus includes a rack lateral to the thermal chamber and in the ambient air. The barrier walls are also lateral to the thermal chamber and the moving platform and its conveyor are supported on the rack.

In this embodiment, the feedthrough card extends laterally from the platform and is guided along its distal edge by a guide track affixed to aluminum sheet (or other structural component) which lines the thermal chamber. And the new apparatus is not limited to a single rack, platform and conveyor.

In yet another embodiment, the rack is a first rack, the barrier walls are first barrier walls, the platform is a first platform, the feedthrough card is a first feedthrough card, the flexible partition is a first flexible partition, and the apparatus includes a second rack lateral to the thermal chamber. A second platform is supported on the second rack and a second feedthrough card extends from the second platform through the second flexible partition into the thermal chamber.

In this "plural rack/plural platform/plural card" embodiment, the first feedthrough card extends laterally from the first platform and is guided along its first distal edge by a first guide track. Similarly, the second feedthrough card extends laterally from the second platform and is guided along its second distal edge by a second guide track.

Other details of the new apparatus are set forth in the following detailed description and in the drawings.

BRIEF DESCRIPTION OF THE DRAWINGS

FIG. 1 is a representative front elevation view of the new test apparatus using plural modules. Separating panels and air flow paths within the apparatus are shown in dashed line. Parts are broken away.

FIG. 2 is a top plan view of the apparatus of FIG. 1. Parts are broken away.

FIG. 4 is a sectional elevation view of a module taken along the viewing axis VA4 of FIG. 2 or FIG. 3.

DETAILED DESCRIPTIONS OF PREFERRED EMBODIMENTS

Figure 3:
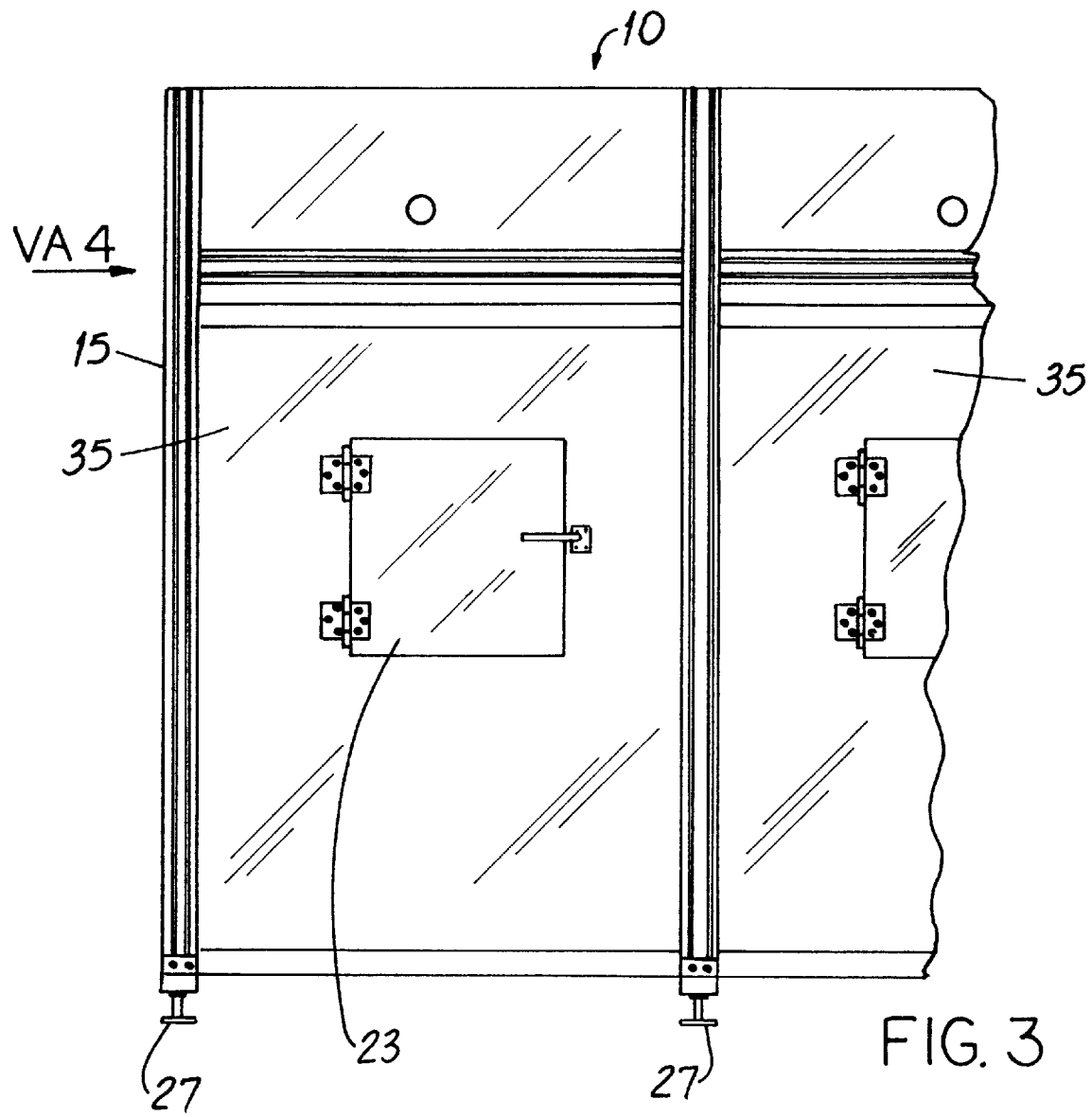
FIG. 3 is an elevation view of plural modules used in the apparatus of FIGS. 1 and 2. One module is broken away.

Before describing details of the new test apparatus 10, it will be helpful to have an overview description of its general arrangement and operation. Referring first to FIGS. 1, 2 and 3, an exemplary embodiment of the new environmental test apparatus 10 has first and second sections 11 and 13, respectively. The first section 11 has several modules 15 coupled to one another and the section 11 is terminated by an entry door module 17 at one end and by an exit door module 19 at the other end.

It is to be appreciated that either section 11, 13 may be used alone to conduct only cold stress testing or only hot stress testing, respectively. When a section 11 is used as an apparatus 10 for cold stress testing only, it is highly preferred to configure the exit door module 19 to have two spaced-apart doors 21. In that way, the doors 21 can be operated sequentially to provide what might be described as an air lock. (It will be apparent from the specification that the doors 21 may be used to remove products from the section 11 and that the right-hand door 21 may be used to place products into section 13.)

Each of the modules 15 has an access door 23 for convenient entry into the thermal chamber 25. And, conveniently, each module 15, 17, 19 has levelling feet 27, thereby permitting the modules 15, 17, 19 to be aligned with one another. Referring also to FIG. 4, an auxiliary chamber 29, described in more detail below, is between the walls 31, 33.

The thermal chamber 25 is horizontally elongate (at least by virtue of two or more modules 15 being attached to one another) and a part of such chamber 25 is within each module 15 behind (to a viewer of FIG. 3) a panel 35. An air plenum 37 is below the thermal chamber 25 and along most of the length of both, the chamber 25 and the plenum 37 are isolated from one another by an imperforate panel 39. But the panel length (measured left-right in FIG. 1) is less than the length of the plenum 37 and chamber 25, thereby providing opening 41, 43 at respective extreme ends of the plenum 37 and chamber 25. A blower 45, e.g., a centrifugal blower, driven by a motor 46 urges air along an elongate, "race track shaped" path 47 through the plenum 37 and the thermal chamber 25. A heat exchange device is embodied as a refrigeration system 49, the evaporator 51 of which is in the air plenum 37. The air being circulated along the plenum 37 and the thermal chamber 25 may thereby be cooled for stress test purposes.

From the foregoing, it is apparent that the first section 11 is configured for use only in depressed-temperature (i.e., depressed from ambient temperature) stress testing. The second section 13 is configured for use only in elevated-temperature stress testing.

The second section 13 differs from the first in that a heating system 53 rather than a refrigeration evaporator 51 is in the air plenum 37. In a specific embodiment, the system 53 includes electrical resistance heaters.

Figure 5:
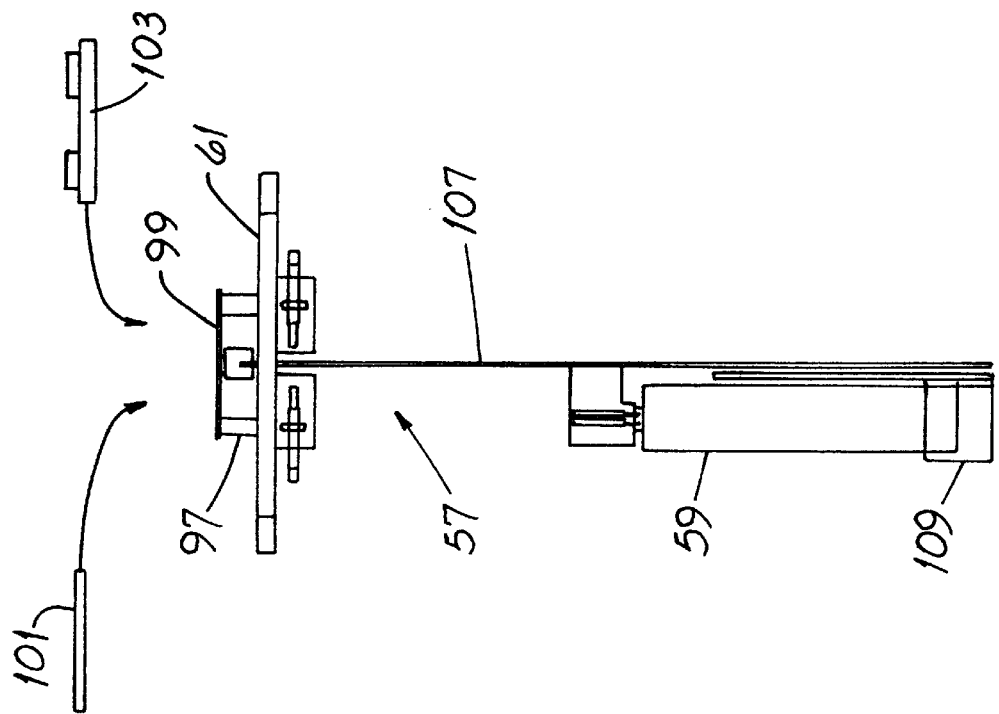
FIG. 5 is an elevation view of the product carrier and the product mounted thereon as shown in FIG. 4.
Figure 10:
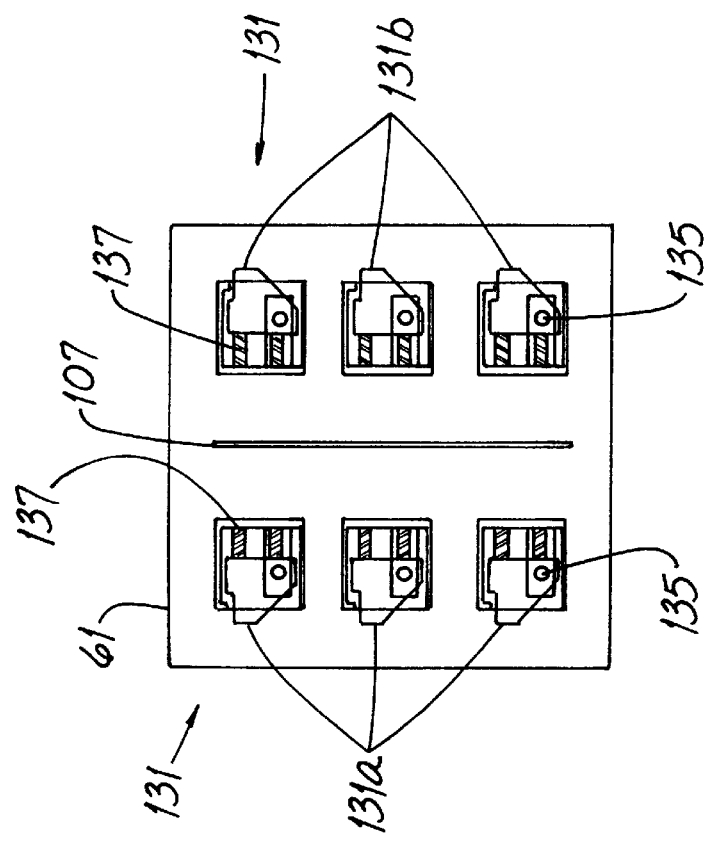
FIG. 10 is a top plan view of a portion of the product carrier shown in FIGS. 4, 5 and 6. Such view is along viewing axis VA10 of FIG. 6.
Figure 6:
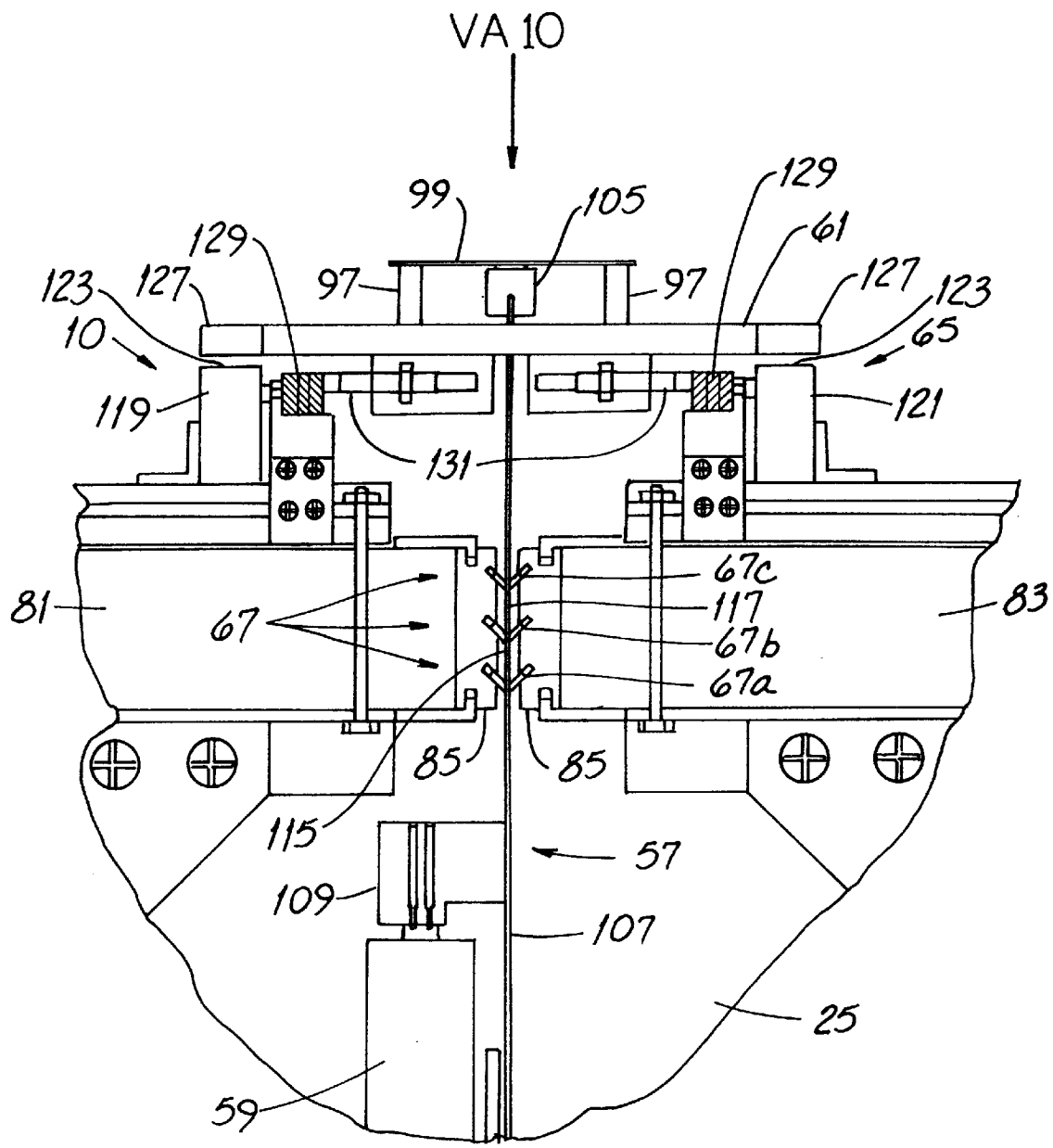
FIG. 6 is an elevation view of a portion of FIG. 4 enlarged to show additional detail. Parts are broken away.
Figure 7:
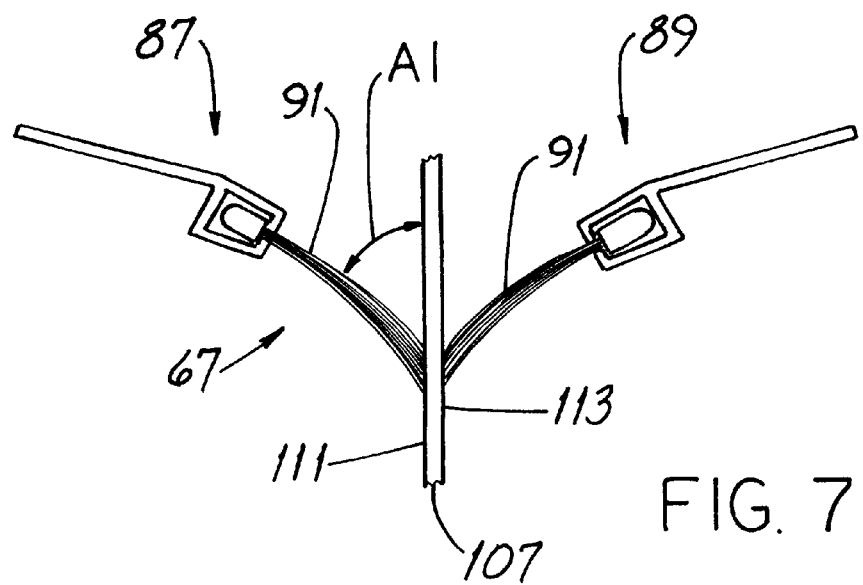
FIG. 7 is an elevation view of a flexible partition shown in conjunction with a feedthrough card of the product carrier.

Referring also to FIGS. 5, 6 and 7, the general interior arrangement of the apparatus 10 includes a flat, vertically-oriented carrier 57 on which a product 59 to be tested is mounted. The carrier 57 is suspended from a platform 61 which is urged along the auxiliary chamber 29 by a conveyor 65 and flexible partitions 67 isolate the auxiliary chamber 29 and the thermal chamber 25 from one another. These features will now be described in more detail.

The new test apparatus 10 has an enclosure 69, within which is the auxiliary chamber 23, the thermal chamber 25 and the air plenum 37. The auxiliary chamber 29 is bounded in part by a first wall 70 comprising first wall parts 31, 33, 71 which are substantially free of insulation. The thermal chamber 25 is bounded in part by a second wall 72 comprising second wall parts 73, 75, 77, each including an insulation layer 79. In a specific embodiment, the thickness of each layer 79 is over one-half of the total thickness of a wall part 73, 75, 77.

Figure 8:
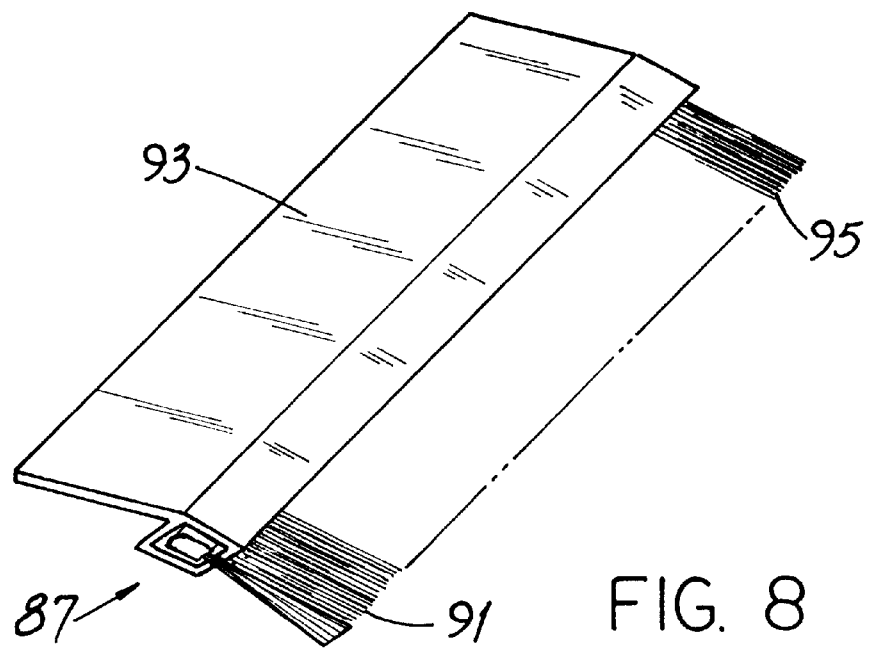
FIG. 8 is a perspective view of a typical partition member used in the partition of FIG. 7.

Referring also to FIG. 8, opposed barrier walls 81, 83 extend from the rear and front, respectively, of the apparatus 10 and each wall 81, 83 terminates in a mounting piece 85. The pieces 85 are spaced slightly from one another and serve to positionally hold a flexible primary partition 67a, the purpose of which is described below. Such primary partition 67a is comprised of first and second partition members 87, 89, respectively, and a preferred partition member 87, 89 includes a brush 91 affixed to an extruded aluminum strip 93 and having flexible bristles 95 which are carbon-bearing bristles for reducing static electricity. Appropriate partition members 87, 89 are available from Sealeze Corporation, Richmond, Va.

A highly preferred apparatus 10 has plural partitions 67, the first auxiliary partition 67b also being comprised of a separate set of members 87, 89, and the second auxiliary partition 67c further being comprised of yet another separate set of members 87, 89. The partitions 67b, 67c are spaced from one another and as is apparent from FIGS. 4 and 6, are interposed between the primary partition 67a and the auxiliary chamber 29. As shown in FIGS. 6 and 7, the brushes 91 of the members 87, 89 are angled with respect to one another and to the carrier card 107 and each such brush 91 defines an acute angle A1 with the carrier 57. Such angled orientation is preferred since, when there is no carrier card 107 between the members 87, 89, such members straighten somewhat and enmesh to form a seal through which air does not easily pass.

A support platform 61 has standoffs 97 mounted atop it for securing a test bed 99 having exposed electrical contact points. An exemplary support platform 61 is a square or rectangular slab about one-half inch thick (about 1.27 cm.) and made of DELRIN™ plastic or the like.

Instrument-type test boards such as a load board 101 or a computer board 103 may be mounted on the test bed 99. A load board 101 applies a load to the product 59 under test to simulate the load or aspects of the load the product 59 will experience in actual application. A computer board 103 periodically "interrogates" the product 59 under test and stores the information for later retrieval and analysis. Points on the test bed 99 and points on the carrier 57 are in electrical contact with one another using edge connectors 105 or other known means.

And it may be desirable to "exercise" a product 59 undergoing stress test by carrying out an operating regimen substantially like that the product 59 will experience in an actual application. To that end, an embodiment of the apparatus 10 shown in FIG. 13 includes a probe 106. The probe 106 is configured to be lowered and raised to electrically connect with the load board 101, board computer 103, the test bed 99 or some other "interface" board supported by the platform 61 and connected to the product 59. The probe 106 is further described below.

A preferred carrier 57 includes what is known as a "feedthrough card 107." A typical card 107 is thin, generally flat, rectangular and has a substantial number of electrical conductors laminated between two insulating layers bonded together. Each of the conductors is "brought out," i.e., exposed at opposite card ends, for making electrical connections thereto. Attached to the carrier 57 is a fixture 109 for releasably mounting an electronic product 59, e.g., a printed circuit board, on the carrier 57.

The carrier 57 is coupled to the support platform 61 and extends downwardly through the partitions 67a, 67b, 67c. The partition members 87, 89 of each partition 67a, 67b, 67c bear against respective surfaces 111, 113 of the card 107. As is now apparent, the partitions 67a, 67b, 67c coact to prevent significant air transfer between the chambers 25, 29.

It is particularly desirable to prevent warmer, more humid air in the auxiliary chamber 29 from migrating or transferring to the thermal chamber 25 since such transfer speeds the rate at which frost accumulates in the thermal chamber 25. To the end of further inhibiting transfer of humid air to the thermal chamber 25, the primary and first auxiliary partitions 67a, 67b, respectively, define a flow path 115 between them. Dry air is caused to flow along the flow path 115, thereby substantially preventing moisture from migrating from the auxiliary chamber 29 to the thermal chamber 25. Good results are obtained by flowing dry air along either one of the flow paths 115, 117 or along both.

Figure 9:
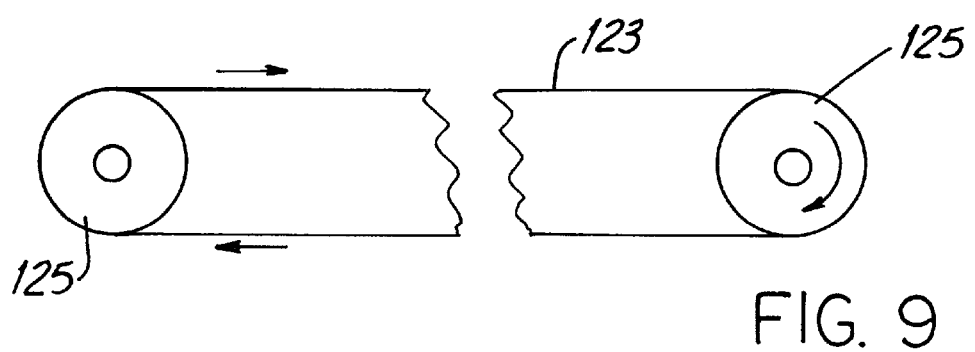
FIG. 9 is a view of a conveyor section used in the apparatus of FIG. 1. Parts are broken away.

Referring next to FIGS. 4, 6 and 9, the conveyor 65 has two spaced-apart sections 119, 121, each such section 119, 121 comprising an endless belt 123 supported by rollers 125 and driven by one roller 125. The spaced-apart edges 127 of the platform 61 rest on respective conveying sections 119, 121. (For clarity, FIG. 6 shows the platform edges 127 spaced slightly above respective conveying sections 119, 121.)

Referring now to FIGS. 4, 5, 6 and 10, it is also highly desirable to be able to electrically operate the products 59 under stress test as they move along through the apparatus 10. Thus, the auxiliary chamber 29 contains a power bus embodied as two parallel, spaced-apart rails 129. The support platform 61 includes collector shoes 131 in electrically-conductive relationship to the power bus rails 129, thereby providing power to products 59 mounted on the carrier 57.

It is highly preferred that electrical continuity between the rails 129, and the support platform 61 and board 101 or 103 mounted thereon be maintained. To that end, the support platform 61 includes a first set of shoes comprising shoes 131a, which are electrically connected in parallel. Similarly, there is a second set of shoes comprising shoes 131b, which are electrically connected in parallel.

In a specific embodiment, each shoe 131 pivots about an axis 135 and is urged toward its respective rail 129 by springs 137. When the platform 61 is so configured, a temporary "bounce" of less than all of the shoes 131a or 131b away from the respective rail 129 will not interrupt the continuity of power to the platform 61.

Referring to FIGS. 1, 2, 4, 11 and 12, the apparatus 10 has at least one module 17 with a door 21 mounted for movement between an open position for placing products 59 in the thermal chamber 25 and a closed position for stress testing the products 59. Door 15 movement is by pneumatic cylinders 139. When the door 21 is closed, it is sealed by an air-inflated seal of a known type. And frost formation on the doors 21 is inhibited by a door heater.

Figure 12:
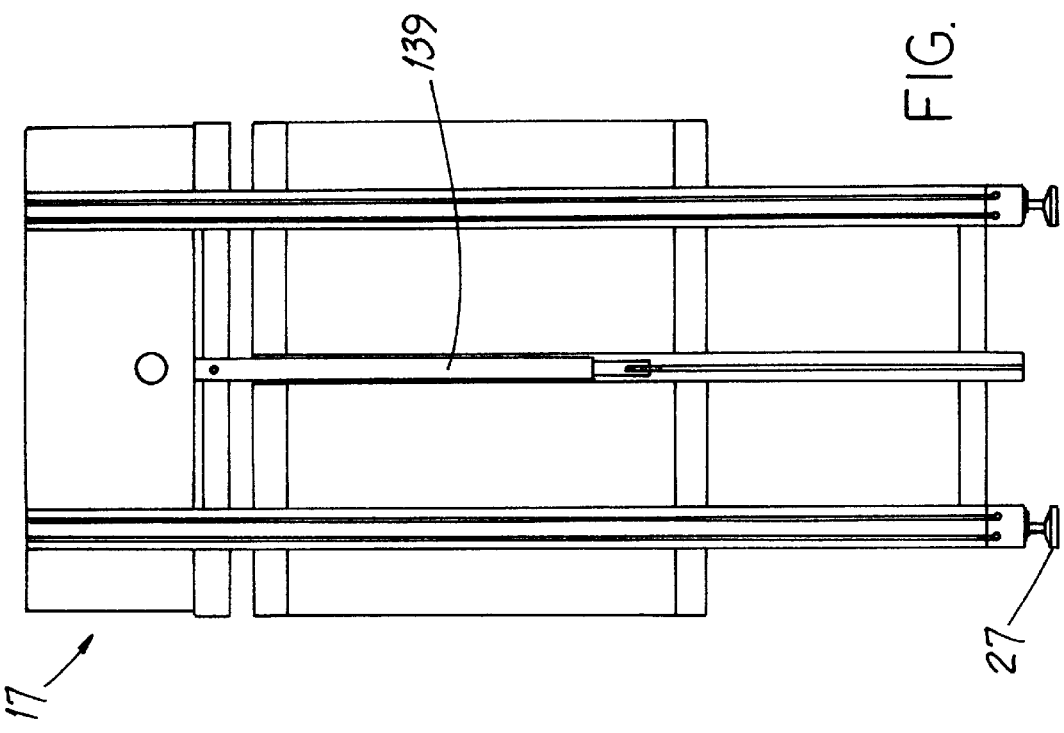
FIG. 12 is an elevation view of the door module of FIG. 11 taken along the viewing axis VA12 thereof.
Figure 11:
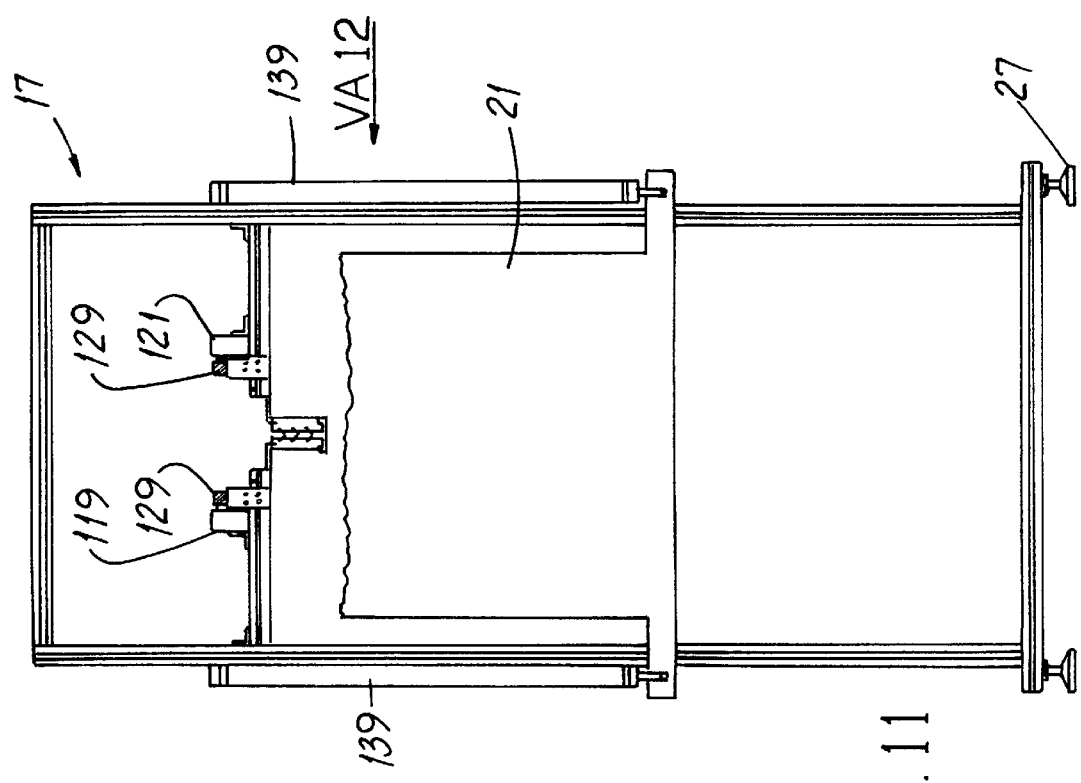
FIG. 11 is a representative elevation view of a door module of the apparatus of FIG. 1. Such elevation view is along viewing axis VA4 of FIGS. 2 or 3.

FIGS. 11 and 12 show a single door entry module 17 20 for purposes of explanation. And the door 21 is broken away to show the interior of the module 17 which is also equipped with conveyor sections 119, 121, bus bars 129 and the like. After appreciating the specification, an exit module 19 and a double door module as shown in FIG. 1 may readily be constructed.

In a highly preferred embodiment, the modules 15, 17, 19 are made using fiberglass sheets 141 for the outer surfaces and aluminum sheets for the inner surfaces 143.

Aluminum structural extrusions 145 available from 80/20, Inc. of Columbia City, Ind. are very useful for joining sheets 141, 143 at corners and at sheet edges.

Figure 13:
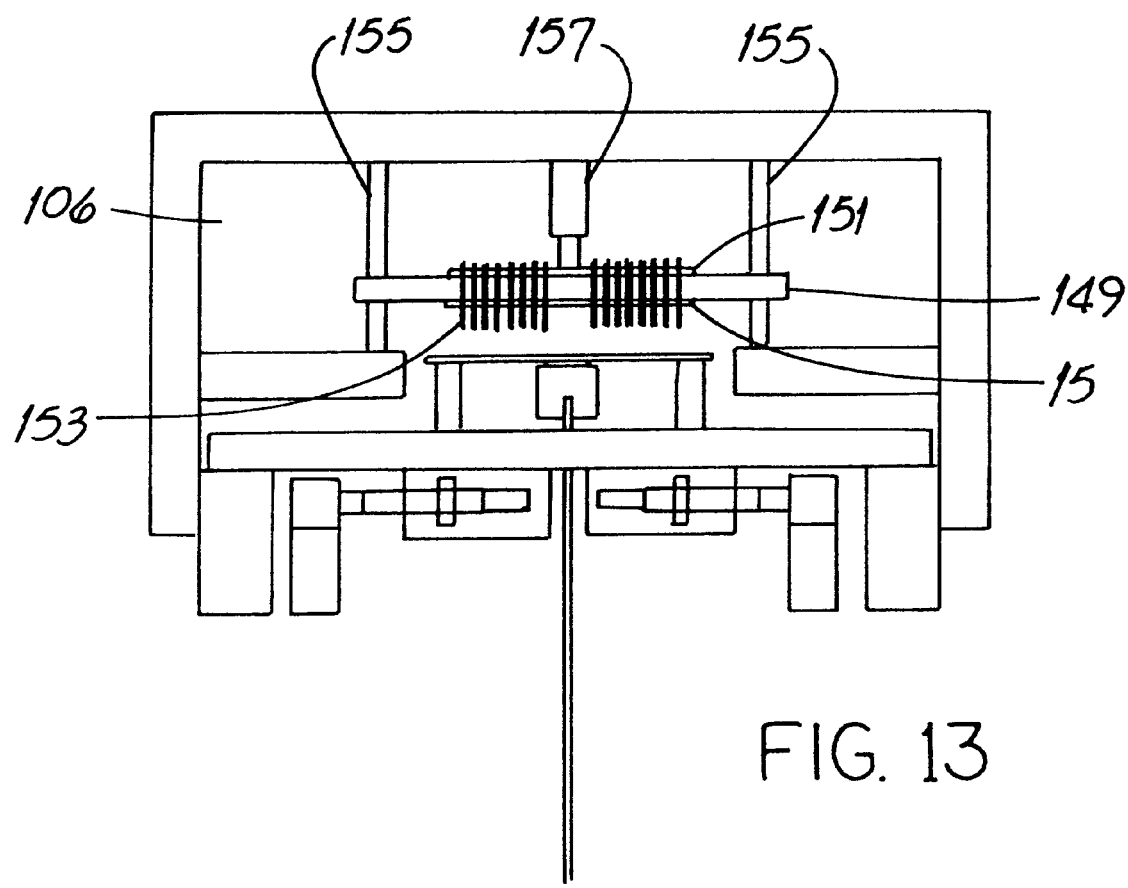
FIG. 13 is a representative elevation view of a portion of another embodiment of the new test apparatus which incorporates a movable test probe. Parts are broken away.

Referring to FIG. 13, the probe 106 includes a stiffening plate 149 having electrical boards 151 mounted thereon. Spring-loaded pins 153 (sometimes referred to as "pogo pins") extend through the plate 149 and the boards 151. (The boards 151 and pins 153 are sometimes referred to in the industry as a "bed of nails.")

When the probe 106 is lowered, the pins 153 contact respective points on the bed 99. Guide rods 155 extend through the plate 149 and the plate 149 and the boards 151 move upwardly and downwardly under the control of a pneumatic cylinder 157. It is to be appreciated that the probe 106 may be mounted for vertical movement only rather than for both vertical movement (i.e., up/down in FIG. 13) and horizontal movement (i.e., left/right in FIGS. 1, 2 and 3). But given the specification, persons of ordinary skill will readily appreciate how to configure the probe 106 to move horizontally along the auxiliary chamber 29.

Figure 14:
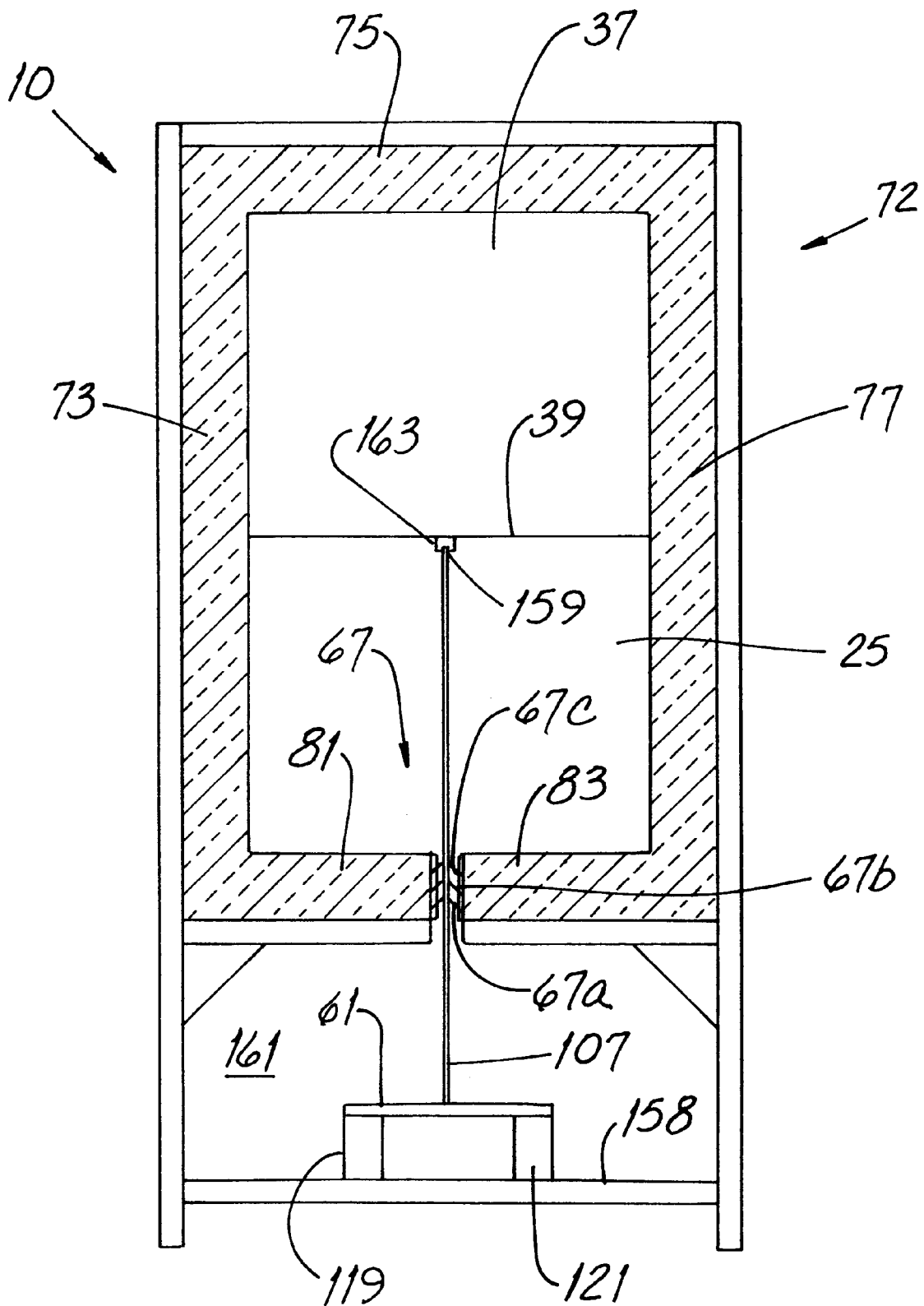
FIG. 14 is a sectional elevation view generally like that of FIG. 4 showing another embodiment of the apparatus.

FIG. 14 shows another embodiment of the new test apparatus 10. In general, such embodiment is inverted from that shown in FIGS. 4 and 6. The apparatus 10 has barrier walls 81, 83 and a second wall 72 comprised of second wall parts 73, 75, 77. The barrier walls 81, 83 and the wall parts 73, 75, 77 are around the thermal chamber 25 and the air plenum 37 above such chamber 25.

Each barrier wall 81, 83 has at least one flexible partition 67 extending toward the other barrier wall 83, 81. In a highly preferred embodiment, the partition 67 includes a primary partition 67a and first and second auxiliary partitions 67b, 67c, respectively. The partitions 67a, 67b, 67c extend upwardly and inwardly toward the thermal chamber 25, rather than downwardly and inwardly as in FIG. 6.

Below the thermal chamber 25, e.g., mounted on the under-frame 158 of the apparatus 10 in an open region 161 (i.e., a region open to ambient air), such apparatus 10 has a platform 61 supported by conveyor sections 119, 121. Extending upwardly from the platform 61 is a carrier feedthrough card 107 supported and guided along its upper, distal edge 159 by an elongate, grooved guide track 163. Some sort of structure, e.g., the guide track 163, steadying the edge 159 is preferred since the card 107 is somewhat fragile. Without the track 163, the card 107 may flex laterally, i.e., from side to side, as the card 107 moves through the chamber 25, i.e., toward or away from the viewer of FIG. 14.

In a specific arrangement, the guide track 163 is mounted to the underside of the panel 39 which separates the thermal chamber 25 and the air plenum 37 from one another. Considering FIGS. 1 and 2, it is apparent that in the embodiment of FIG. 14, the refrigeration system 49, the evaporator 51, the blower(s) 45 and motor(s) 46, and the heating system 53 are mounted in such a way that the air path 47 is through the plenum 37 and the chamber 25. The apparatus 10 of FIG. 14 is shown in a simplified view; the power bus rails 129, shoes 131, test board 99, load board 101, computer board 103, electrical board 151, pins 153, guide rods 155 and cylinder 157 are, but for inversion consistent with the embodiment of FIG. 14, generally as described above and as shown in earlier FIGURES.

Figure 15:
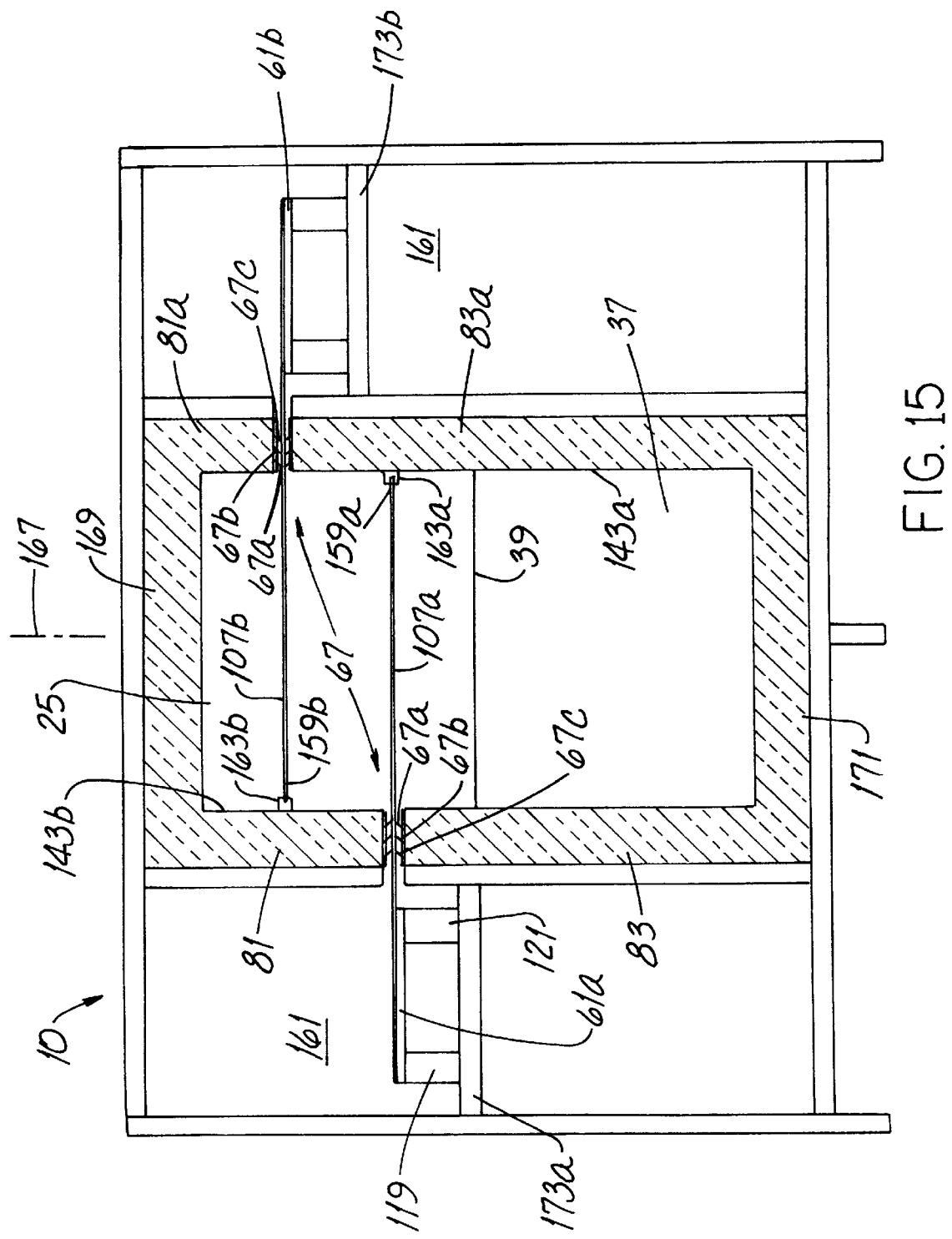
FIG. 15 is a sectional elevation view generally like that of FIGS. 4 and 14 disclosing, along with the related specification, yet other embodiments of the apparatus.

A portion of FIG. 15 shows yet another embodiment of the new apparatus 10 (a "single rack/single platform/single feedthrough card" embodiment) and when considered in its entirety, FIG. 15 shows yet a third embodiment including two racks, two platforms and two feedthrough cards. Either arrangement might be described as a side-mounted arrangement.

In the third embodiment, components to the left of the plane 167 (or, like card 107a and track 163a, originating left of such plane 167 or associated with such components) are identified as "first," e.g., a first pair of barrier walls 81, 83, a first feedthrough card 107a and so forth. Similarly, components to the right of the plane 167 are identified as "second," e.g., a second platform, a second rack and so forth. (And, of course, components to the right of the plane could just as well be identified as "first" and those to the left as "second.")

The apparatus 10 of FIG. 15 has at least one pair of barrier walls 81, 83 and, most preferably, has another pair of barrier walls 81a, 83a. The barrier walls 81, 81a, 83, 83a and the upper and lower wall parts 169, 171, respectively, are around the thermal chamber 25 and the air plenum 37 below such chamber 25 and cooperate to insulate such plenum 37 and chamber 25.

Each barrier wall 81, 83, 81a, 83a has flexible partitions 67 of the type described above. The primary partitions 67a and the first and second auxiliary partitions 67b, 67c, respectively, extend laterally and inwardly toward the thermal chamber 25.

The apparatus 10 of FIG. 15 has at least one side frame 173a and if configured to move two or more feedthrough cards 107a, 107b through the chamber 25 simultaneously, the apparatus 10 has a second side frame 173b. Like the underframe 158 shown in FIG. 14, each of the side frames 173a, 173b is in a region 161 open to ambient air. Conveyor sections 119, 121 are mounted on each side frame 173a, 173b, and support a respective platform 61a, 61b thereon.

A carrier feedthrough card 107a, 107b extends laterally from each platform 61a, 61b, respectively, and through the flexible partitions 67 to an elongate, grooved guide track 163a, 163b. The distal edges 159a, 159b of cards 107a, 107b, respective, are supported by such tracks 163a, 163b, respectively. In a specific arrangement, the guide tracks 163a, 163b, are mounted on respective aluminum sheets 143a, 143b. Guide tracks are preferred since without them, the cards 107a, 107b are supported "cantilever-fashion" and may flex up and down as they move through the chamber 25.

Since in the embodiments of FIGS. 4 and 14, the thermal chamber 25 is above the air plenum 37, the refrigeration system 49, the evaporator 51, the blower(s) 45 and motor(s) 46, and the heating system 53 may be arranged as shown in FIGS. 1 and 2. And as with the apparatus 10 of FIG. 14, the apparatus 10 of FIG. 15 is shown in a simplified view; the power bus rails 129, shoes 131, test board 99, load board 101, computer board 103, electrical board 151, pins 153, guide rods 155 and cylinder 157 are, but for modifications to facilitate lateral placement of the platform(s) 61, generally as described above and as shown in FIGS. 1–13.

(After appreciating the foregoing, it will be understood that, as to the embodiments of FIG. 15, the thermal chamber 25 and the air plenum 37 may be juxtaposed from their respective positions shown in that FIGURE. That is, the thermal chamber 25 may be below the air plenum 37 and the positions of the barrier walls 81, 83, 81a, 83a relocated accordingly.)

As used herein, the phrase "dry air" means air, the relative humidity of which is in the range of 5–10% or less. As used herein, the term "thermal chamber" means a chamber, the interior of which exhibits wide excursions of temperature, e.g., temperature "swings" of +125° C. to +23° C. (about +255° F. to +730° F.), +23° C. to −65° C. (about +73° F. to −85° F.), or even +125° C. to −65° C. (about +255° F. to −85° F.) during stress testing. The term "stress testing" means testing electrical products using one or more wide temperature excursions. The term "ambient air" means air which is not subjected to excursions of temperature, e.g., room air.

While the principles of the invention have been shown and described in connection with a few preferred embodiments, it is to be understood clearly that such embodiments are by way of example and are not limiting. As other examples, the new apparatus 10 may be configured to provide "hot only" stress testing, i.e., stressing testing involving temperatures above room ambient. In that instance, the module 15 terminating the section 13 may not require a door 21. A hot air "curtain," or "knife" as it is sometimes called, is adequate.

And cold stress testing may be carried out using a refrigeration unit separate from and ducted to the apparatus 10. Such unit preferably has two redundant evaporators 51 so that one evaporator 51 may be disabled and defrosted while the other evaporator 51 is cooling air flowing through the thermal chamber 25.

What is claimed:

1. In an improved environmental test apparatus for stress testing electronic products, said improved environmental test chamber comprising:

a thermal chamber;

a wall separating said thermal chamber from ambient air, said wall comprising a pair of barrier walls having a flexible partition interposed therebetween, said barrier walls and said flexible partition substantially isolating said ambient air from said thermal chamber;

a platform in said ambient air;

a feedthrough card extending from said platform through said flexible partition into said thermal chamber; and a conveyor in said ambient air and urging said platform along said flexible partition during testing of said electronic products.

2. The improved environmental test apparatus of claim 1 wherein said barrier walls are below said thermal chamber and said platform is below said barrier walls.

3. The improved environmental test apparatus of claim 2, wherein said feedthrough card extends upwardly from said platform.

4. The improved environmental test apparatus of claim 3, wherein said feedthrough card has a distal edge and said feedthrough card is guided along said distal edge by a guide track.

5. The improved environmental test apparatus of claim 1 wherein the thermal chamber is horizontally elongate and the apparatus includes a horizontally elongate air plenum above the said thermal chamber.

6. The improved environmental test apparatus of claim 3 wherein the thermal chamber is horizontally elongate and the apparatus includes a horizontally elongate air plenum above said thermal chamber.

7. The improved environmental test apparatus of claim 1, further comprising a rack lateral to said thermal chamber, wherein said barrier walls are lateral to said thermal chamber, and said platform is supported on said rack.

8. The improved environmental test apparatus of claim 7, wherein said feedthrough card has a distal edge said feedthrough card extends laterally from said platform and said feedthrough card is guided along said distal edge by a guide track.

9. The improved environmental test apparatus of claim 7, wherein said rack is a first rack, said barrier walls are first barrier walls, said platform is a first platform, said feedthrough card is a first feedthrough card, said flexible partition is a first flexible partition, and said improved environmental test apparatus includes:

a second rack lateral to said thermal chamber;

a second platform supported on said second rack; and a second feedthrough card extending from said second platform through said second flexible partition into said thermal chamber.

10. The improved environmental test apparatus of claim 9, wherein:

said first and second feedthrough cards have first and second distal edges, respectively;

said first feedthrough card extends laterally from said first platform and is guided along said first distal edge by a first guide track; and said second feedthrough card extends laterally from said second platform and is guided along said second distal edge by a second guide track.

* * * * *

UNITED STATES PATENT AND TRADEMARK OFFICE
CERTIFICATE OF CORRECTION

PATENT NO. : 5,929,340

DATED : July 27, 1999

INVENTOR(S) : John Cochran and Roger L. Perry

It is certified that error appears in the above-identified patent and that said Letters Patent is hereby corrected as shown below:

At column 5, line 35, change "23", to --29--.
At column 7, line 24, delete "15".
At column 7, line 28, delete "20".
At column 9, line 37, change "+730 " to --+73 --.
At column 10, line 27, delete "the".

Signed and Sealed this

Thirtieth Day of May, 2000

Attest:

Q. TODD DICKINSON

Attesting Officer         Director of Patents and Trademarks